(12) United States Patent  
Chen

(10) Patent No.: US 7,799,429 B2
(45) Date of Patent: Sep. 21, 2010

(54) HYBRID COATING STRUCTURE

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 952 days.

(21) Appl. No.: 11/559,827

(22) Filed: Nov. 14, 2006

(65) Prior Publication Data

US 2007/0128399 A1 Jun. 7, 2007

(30) Foreign Application Priority Data

Dec. 2, 2005 (CN) .......................... 200510102019

(51) Int. Cl.
*B32B 9/00* (2006.01)
(52) U.S. Cl. ....................... 428/408; 428/323; 428/457; 428/698; 428/699; 428/704
(58) Field of Classification Search ................. 428/408, 428/215, 698, 335, 699, 457, 704; 204/192.15
See application file for complete search history.

(56) References Cited

U.S. PATENT DOCUMENTS

| 5,567,512 A | 10/1996 | Chen et al. |
| 5,718,976 A * | 2/1998 | Dorfman et al. ............ 428/408 |
| 6,193,770 B1 * | 2/2001 | Sung ............................ 51/295 |
| 2005/0011748 A1 * | 1/2005 | Beck et al. ............. 204/192.12 |
| 2005/0014010 A1 * | 1/2005 | Dumm et al. ............... 428/472 |

OTHER PUBLICATIONS

Cao et al., Friction and wear characteristics of ceramic nanocomposite coatins: Titanium carbide/amorphous hydrocarbon, Jul. 16, 2001, Applied Physics Letters, 79(3), p. 329-331.*

* cited by examiner

*Primary Examiner*—Timothy M Speer
(74) *Attorney, Agent, or Firm*—Jeffrey T. Knapp

(57) ABSTRACT

A hybrid coating structure (500) includes a substrate (510) and a hybrid coating (100). The hybrid coating further includes a number of diamond-like carbon grains (110), each grains containing a number of superhard nano-particles (120) incorporated therein; and a number of corrosion-resistant nano-particles (130). The superhard nano-particles are comprised of a material selected from the group consisting of silicon carbide, titanium carbide, and titanium nitride. The corrosion-resistant nano-particles are comprised of a material selected from the group consisting of chrome and chrome nitride. A method for making a hybrid coating structure includes steps of: providing a substrate; producing carbon plasma, superhard particle plasma and corrosion-resistant particle plasma by a sputtering method; and depositing a hybrid coating.

9 Claims, 5 Drawing Sheets

HYBRID COATING STRUCTURE

BACKGROUND OF THE INVENTION

1. Field of the Invention

The invention relates generally to wear resistant coatings, and more particularly, to a hybrid coating structure for molds and a method for making the same.

2. Description of Related Art

Coatings are commonly formed on a surface of objects, such as molds, thin films and recording discs, etc. The coatings function to protect the underlying layer from damage and wear caused by repeated use. For example, diamond-like carbon (DLC) coatings are conventionally used to protect molds as an overcoat to improve the wear resistance of the molds. The diamond-like carbon coating provides a smooth surface for the molds and minimizes friction of the surface.

Methods for producing diamond-like carbon coatings include carbon deposition by sputtering method—typically direct current magnetron sputtering, in which the ionized gases are directed onto the target by magnetic fields generated in a sputtering device. According to this method, a carbon substrate is sputtered onto a target substrate in a low-pressure argon (Ar) atmosphere until a coating of a desired thickness is reached. The resulting diamond-like carbon coating has a predominant amorphous structure with "islands" of diamond-like crystalline grains.

The properties of the diamond-like carbon coating depend on a mixture proportion of the diamond-like crystalline grains and the amorphous structure. The diamond-like crystalline grains can impart hardness to the target substrate. Unfortunately, there are many gaps between the diamond-like crystalline grains. Corrosion particles are likely to enter the gaps and can corrode the diamond-like carbon coatings, eventually resulting in its failure.

Therefore, these coatings have a poor durability, which necessitates their frequent repair and even total renewal. The frequent repair and touch-up of the coatings may affect molding performance and quality. Further, the downtime associated with maintaining the coating significantly affects productivity. Coatings in use today do not perform adequately because of the low wear and corrosion resistance.

What is needed, therefore, is a coating has high degree of wear resistance and corrosion resistance.

SUMMARY OF THE INVENTION

The present invention provides a hybrid coating structure. In one embodiment, the hybrid coating structure includes a substrate and a hybrid coating. The hybrid coating is formed on the substrate. The hybrid coating further includes a number of diamond-like carbon grains, each grain containing a number of superhard nano-particles incorporated therein; and a number of corrosion-resistant nano-particles. The diamond-like carbon grain includes a material selected from the group consisting of amorphous hydrogenated diamond-like carbon, amorphous nitrogenated diamond-like carbon, and amorphous hydrogen-nitrogenated diamond-like carbon. The superhard nano-particles are comprised of a material selected from the group consisting of silicon carbide, titanium carbide, and titanium nitride. The superhard nano-particles are mixed within the diamond-like carbon grains.

The corrosion-resistant nano-particles are comprised of a material selected from the group consisting of chrome and chrome nitride. The corrosion-resistant nano-particles fill gaps between adjacent diamond-like carbon grains. The diamond-like carbon grains containing the superhard nano-particles and the corrosion-resistant nano-particles cooperatively form a network.

A method for making an above-described hybrid coating structure includes steps of: providing a substrate in a sputtering device; sputtering a carbon target to produce carbon plasma; sputtering a superhard material target to produce superhard particle plasma; sputtering a corrosion-resistant material target to produce corrosion-resistant particle plasma; and moving the substrate in a manner such that the substrate is exposed to the carbon plasma, the superhard particle plasma and the corrosion-resistant particle plasma in a repeating sequence, thus depositing a hybrid coating on the substrate.

Advantages and novel features of the present hybrid coating structure and method for making the same will become more apparent from the following detailed description of preferred embodiments when taken in conjunction with the accompanying drawings.

BRIEF DESCRIPTION OF THE DRAWINGS

Many aspects of the present hybrid coating structure and method for making the same can be better understood with reference to the following drawings. The components in the drawings are not necessarily drawn to scale, the emphasis instead being placed upon clearly illustrating the principles of the present invention.

Figure 1:
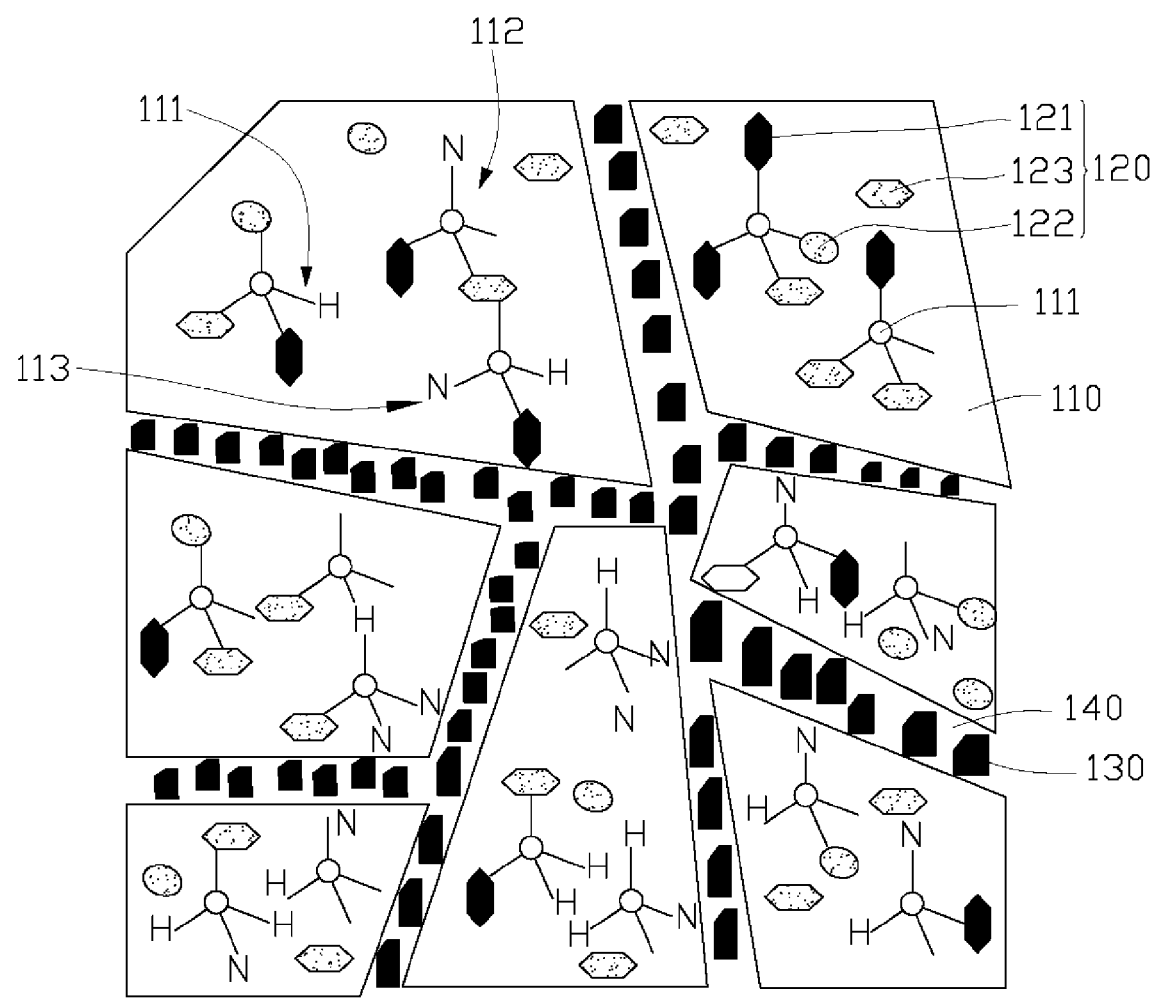
FIG. 1 is a schematic micro-view of a hybrid coating structure in accordance with a preferred embodiment of the present invention.

Corresponding reference characters indicate corresponding parts throughout the several views. The exemplifications set out herein illustrate at least one preferred embodiment of the present hybrid coating structure, in one form, and such exemplifications are not to be construed as limiting the scope of the invention in any manner.

DETAILED DESCRIPTION OF THE INVENTION

Reference will now be made to the drawings to describe embodiments of the present hybrid coating structure and method for making the same in detail.

Figure 5:
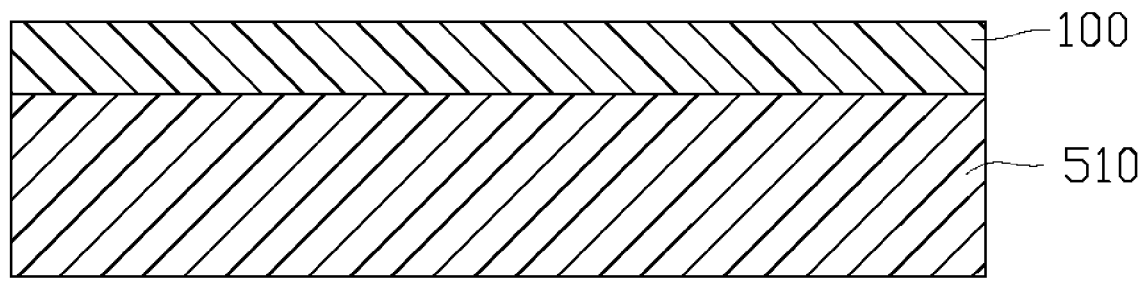
FIG. 5 is a schematic side-view of the hybrid coating structure of FIG. 1.

Referring to FIG. 1 and FIG. 5, a hybrid coating structure 500 according to a preferred embodiment of the present invention is shown. The hybrid coating structure 500 includes a substrate 510 and a hybrid coating 100. The hybrid coating 100 is formed on the substrate 510. The hybrid coating 100 further comprises a number of diamond-like carbon grains 110, each grain containing a number of superhard nano-particles 120 incorporated therein; and a number of corrosion-resistant nano-particles 130.

The diamond-like carbon grain 110 includes a material selected from the group consisting of amorphous hydrogenated diamond-like carbon 111, amorphous nitrogenated diamond-like carbon 112, and amorphous hydrogen-nitrogenated diamond-like carbon 113. The superhard nano-particles 120 are comprised of a material selected from the group consisting of silicon carbide 121, titanium carbide 122, and titanium nitride 123. The superhard nano-particles 120 are mixed with the diamond-like carbon grains 110. The corrosion-resistant nano-particles 130 are comprised of a material selected from the group consisting of chrome and chrome nitride. The corrosion-resistant nano-particles 130 fill gaps 140 between neighboring diamond-like carbon grains 110.

The superhard nano-particles 120 are distributed evenly in the diamond-like carbon grains 110. The corrosion-resistant nano-particles 130 are distributed evenly in the gaps 140 between adjacent diamond-like carbon grains 110. As such, a hybrid network structure is formed by the diamond-like carbon grains 110 containing the superhard nano-particles 120 and the corrosion-resistant nano-particles 130. A thickness of the hybrid coating 100 is in the range from 20 nanometers to 3000 nanometers. The preferred thickness of the hybrid coating 100 is in the range from 100 nanometers to 2000 nanometers.

The hybrid coating 100 is designed for coating an object such as a mold. The superhard nano-particles 120 are connected to the amorphous hydrogenated diamond-like carbon 111, amorphous nitrogenated diamond-like carbon 112 and amorphous hydrogen-nitrogenated diamond-like carbon amorphous hydrogen-nitrogenated diamond-like carbon 113 with dangling bonds. The superhard nano-particles 120 can enhance the wear resistance of the hybrid coating 100. Besides, the corrosion-resistant nano-particles 130 fill in the gaps 140 to enhance the corrosion resistance of the hybrid coating 100.

The substrate 510 is comprised of a material selected from the group consisting of iron (Fe), carbon (C), chromium (Cr), molybdenum (Mo), silicon (Si), nickel (Ni), titanium (Ti), tungsten (W), manganese (Mn), vanadium (V) and any combination alloy thereof, such as Fe—C—Cr, Fe—C—Cr—Mo, Fe—C—Cr—Si, Fe—C—Cr—Ni—Mo, Fe—C—Cr—Ni—Ti, Fe—C—Cr—W—Mn, Fe—C—Cr—W—V, Fe—C—Cr—Mo—V and Fe—C—Cr—Mo—V—Si. The substrate 510 should be mirror polished. The hybrid coating 100 can also be one composition selected from the following list: a-C:NH+TiC+Cr (amorphous hydrogen-nitrogen-doped carbon plus TiC and Cr nano-particles), a-C:NH+TiC+CrN, a-C:NH+SiC+Cr, a-C:NH+SiC+CrN, a-C:NH+TiN+Cr, a-C:NH+TiN+CrN, a-C:NH+TiC+SiC+Cr, a-C:NH+TiC+SiC+CrN, a-C:NH+SiC+TiC+TiN+Cr, a-C:NH+SiC+TiC+TiN+CrN, and a-C:NH+SiC+TiC+TiN+Cr+CrN. A thickness of the hybrid coating 100 is in the range from 20 nanometers to 3000 nanometers and the preferred thickness is in the range from 100 nanometers to 2000 nanometers.

Figure 2:
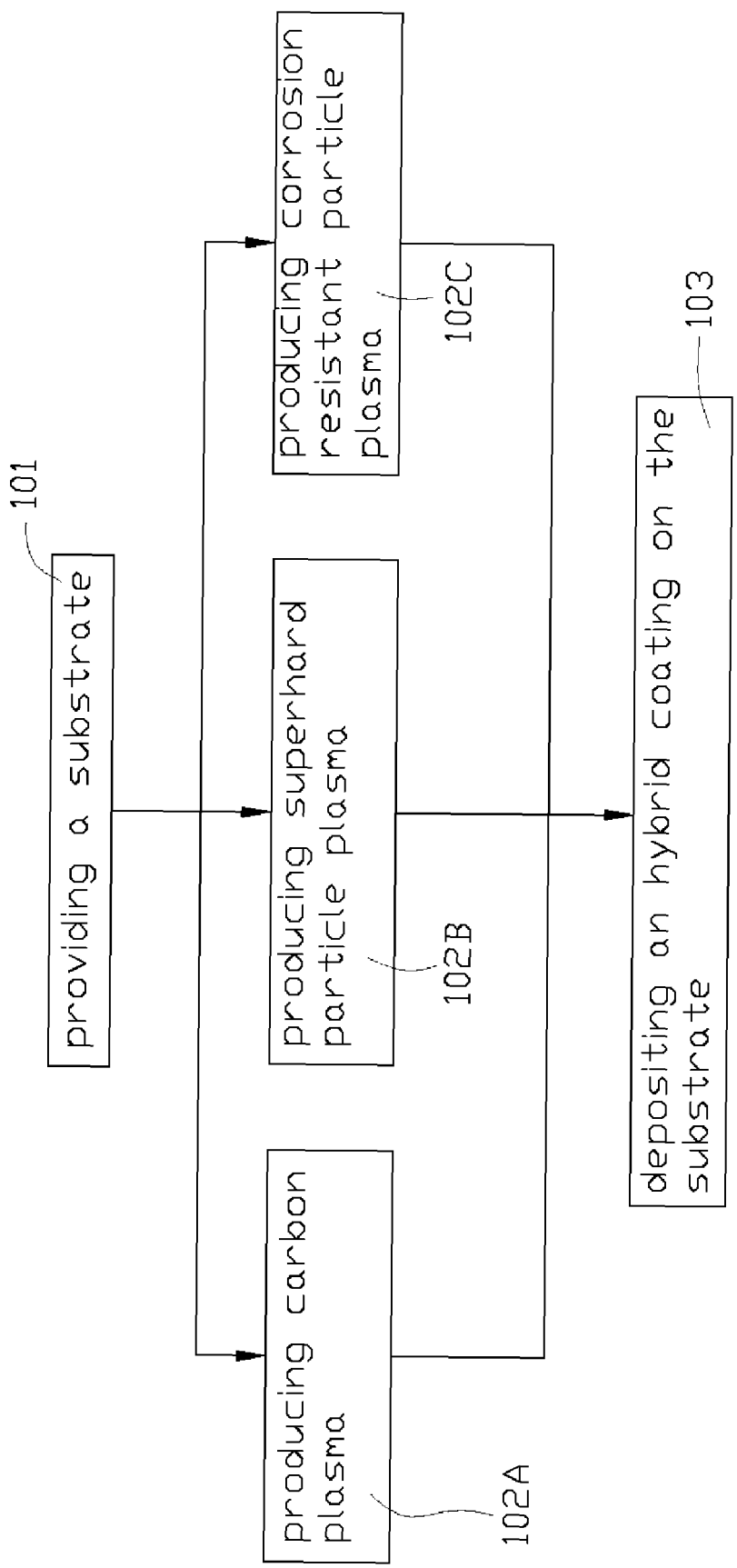
FIG. 2 is a flow chart of a method for making the hybrid coating structure of FIG. 1.

Referring to FIG. 2, a method for making a hybrid coating structure includes steps of:

step 101: providing a substrate in a sputtering device;

step 102A: sputtering a carbon target to produce carbon plasma;

step 102B: sputtering a superhard material target to produce superhard particle plasma;

step 102C: sputtering a corrosion-resistant material target to produce corrosion-resistant particle plasma; and step 103: moving the substrate in a manner such that the substrate is exposed to the carbon plasma, the superhard particle plasma and the corrosion-resistant particle plasma in a repeating sequence, thus depositing a hybrid coating on the substrate.

Figure 3:
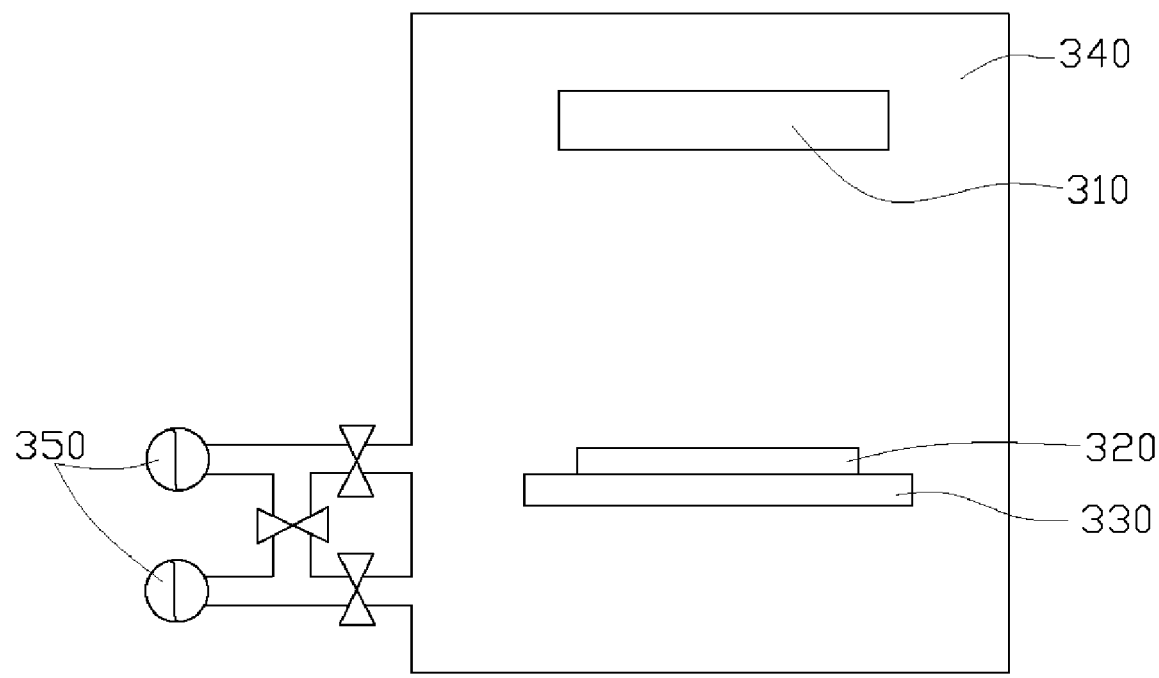
FIG. 3 is a schematic, cross-sectional view of a sputtering device for making the hybrid coating structure of FIG. 1.

FIG. 3 is a schematic, cross-sectional view of a sputtering device 300 for making a hybrid coating structure like that shown in FIG. 5. The sputtering device 300 includes a substrate 320, a substrate holder 330, a sputtering target disk 310, a reaction chamber 340 and a number of gas valves 350. The substrate 320 is comprised of a material selected from the group consisting of iron, carbon, chromium, molybdenum, silicon, nickel, titanium, tungsten, manganese, molybdenum, vanadium and any combination alloy thereof. The substrate 320 is placed on the substrate holder 330. The sputtering target disk 310 is placed above the substrate 320. The substrate 320 and the sputtering target disk 310 are placed in the reaction chamber 340. The gas valves 350 are configured (i.e., structured and arranged) for supplying reaction gases into the reaction chamber 340.

Figure 4:
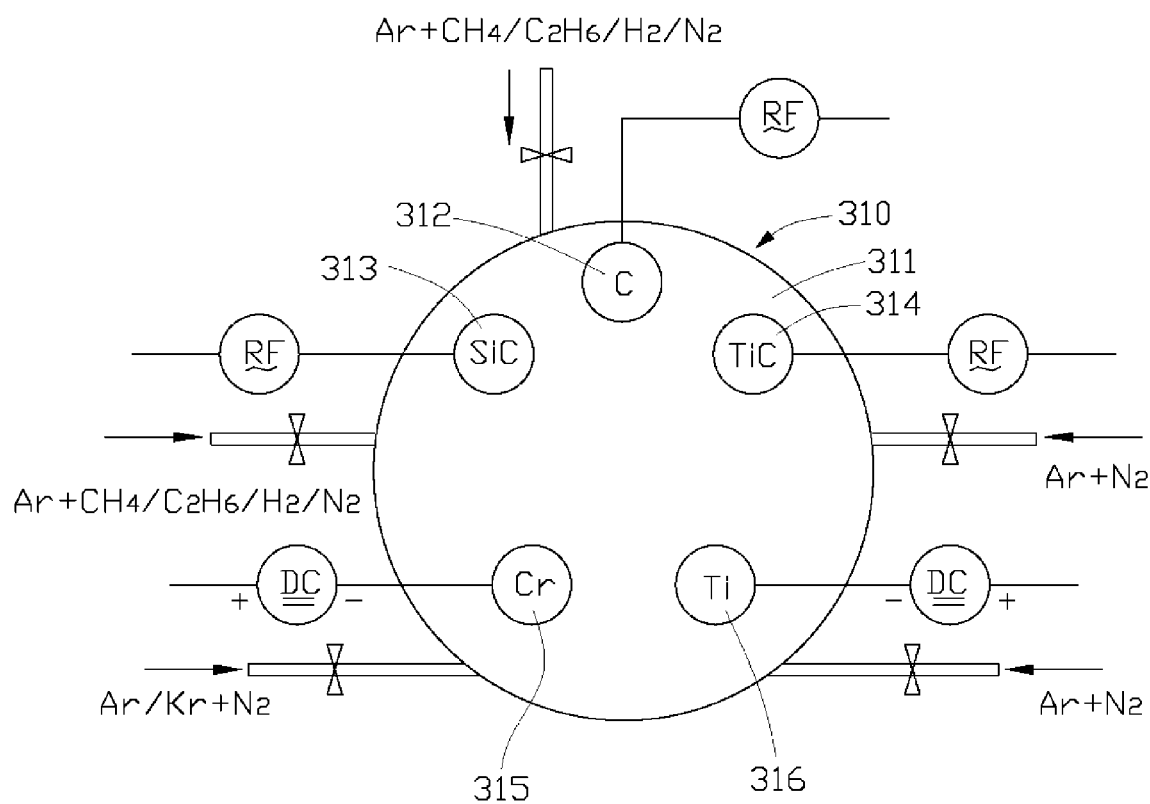
FIG. 4 is a schematic, top cross-sectional view of the sputtering device of FIG. 3 showing a layout of sputtering targets.

Referring to FIG. 4, the sputtering target disk 310 includes a disk 311, a carbon target 312, a silicon carbide target 313, a titanium carbide target 314, a chrome target 315 and a titanium target 316. A hybrid coating 100 (not shown in FIG. 4, but visible in FIG. 1) is made using a co-sputtering method. The co-sputtering can be a method for making a coating by a combination of radio frequency sputtering and direct current magnetron sputtering with more than three target materials. By sputtering carbon target 312, silicon carbide 313, titanium carbide 314, chrome 315 and titanium 316 target materials and mixing inert gases Ar, Kr, $H_2$, $N_2$, $CH_4$ or $C_2H_6$, the hybrid coating 100 can be sputtered to form a coating with the composition a-C:NH (amorphous hydrogen-nitrogen-doped carbon) plus SiC, TiC, TiN, Cr, and CrN nano-particles.

The substrate 320 is rotated so as to be exposed to the carbon plasma, the superhard particle plasma and the corrosion-resistant particle plasma in a repeating sequence, a rotation rate of the substrate being in the range from 10 to 300 revolutions per minute, with a preferred rotation rate in the range from 20 to 80 revolutions per minute. The substrate 320 can be rotatable in order to obtain the desired composition with thickness uniformity.

Radio frequency (RF) power (not labeled) of 13.56 MHz is supplied to the carbon target 312, the silicon carbide target 313 and the titanium carbide target 314 respectively. The cathodes of the radio frequency power supplies can be an RF diode or RF magnetron. Direct current magnetron power supplies are used for the chrome target 315 and the titanium target 316 with negative voltage applied to the targets. The purpose of the magnetron is used to enhance plasma density.

The reaction gases near the carbon target 312 can be a mixture of Ar and $CH_4$ (methane), a mixture of Ar and $C_2H_6$ (ethane), a mixture of Ar and $H_2$ (hydrogen gas) or a mixture of Ar and $N_2$ (nitrogen gas). The reaction gases near the silicon carbide target 313 can be Ar plus $CH_4$, Ar plus $C_2H_6$, Ar plus $H_2$ or Ar plus $N_2$ mixture. The reaction gas near the titanium carbide target 314 can be Ar plus $N_2$ mixture. The reaction gas near the titanium target 316 can be Ar plus $N_2$ mixture. The reaction gases near the chrome target 315 can be pure Ar gas, Kr (krypton) gas, Ar+$N_2$, or Kr+$N_2$ mixture. The gas percentage of $CH_4$ or $H_2$ versus Ar can be from approximately 5% to 20% by volume. The gas percentage of $N_2$ versus Ar can be from approximately 5% to 40% by volume.

Reactive sputtering uses multiple gas mixtures with individual mass flow rate controller (MFC) to regulate the flow rate. The vacuum system is firstly evacuated to a large extent by a mechanical pump (not shown). Then, it can be switched to a extreme low pressure turbo pump system via a valve and be evacuated to a base pressure of less than about $9 \times 10^{-7}$ torr before sputtering. A thickness of the nano-network hybrid coating 100 is in the range from 20 nanometers to 3000 nanometers, and the preferred thickness is in the range from 100 nanometers to 2000 nanometers.

The RF power supply can have a frequency of about 13.56 MHz. The target/cathode is connected with a matching network. With inductors and capacitors within the matching network, the forward power from the RF power supply can be tuned and maximized so that the reflecting power is minimized.

The present nano-network hybrid coating 100 can also be used as a coating film for various other components, such as sliding components, dies, cutting tools, wear-resistant machine parts, abrasive components, and magnetic and optical parts.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A hybrid coating structure, comprising:
    a substrate; and
    a hybrid coating formed on the substrate, the hybrid coating comprising:
        a plurality of diamond-like carbon grains, each grain containing a plurality of superhard nano-particles incorporated therein; and
        a plurality of corrosion-resistant nano-particles filling gaps between neighboring diamond-like carbon grains;
        the diamond-like carbon grains and the corrosion-resistant nano-particles cooperatively forming a network, wherein the corrosion-resistant nano-particles are evenly distributed in all the gaps between neighboring diamond-like carbon grains.

2. The hybrid coating structure as claimed in claim 1, wherein the diamond-like carbon grains further comprise a material selected from the group consisting of amorphous hydrogenated diamond-like carbon, amorphous nitrogenated diamond-like carbon, and amorphous hydrogen-nitrogenated diamond-like carbon.

3. The hybrid coating structure as claimed in claim 2, wherein the superhard nano-particles are comprised of a material selected from the group consisting of silicon carbide, titanium carbide, and titanium nitride.

4. The hybrid coating structure as claimed in claim 1, wherein the corrosion-resistant nano-particles are comprised of a material selected from the group consisting of chrome and chrome nitride.

5. The hybrid coating structure as claimed in claim 1, wherein the superhard nano-particles are distributed evenly in the diamond-like carbon grains.

6. The hybrid coating structure as claimed in claim 1, wherein a thickness of the hybrid coating is in the approximate range from 20 nanometers to 3000 nanometers.

7. The hybrid coating structure as claimed in claim 6, wherein a thickness of the hybrid coating is in the approximate range from 100 nanometers to 2000 nanometers.

8. The hybrid coating structure as claimed in claim 1, wherein the substrate is comprised of a material selected from the group consisting of iron, carbon, chromium, molybdenum, silicon, nickel, titanium, tungsten, manganese, vanadium and any combination alloy thereof.

9. The hybrid coating structure as claimed in claim 1, wherein the gaps are in communication with each other.

* * * * *